(12) United States Patent
Unhold (10) Patent No.: US 9,722,659 B2
(45) Date of Patent: Aug. 1, 2017

(54) FREQUENCY RAMP GENERATION

(71) Applicant: Infineon Technologies AG, Neubiberg (DE)

(72) Inventor: Christian Unhold, Linz (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/069,098

(22) Filed: Mar. 14, 2016

(65) Prior Publication Data

US 2016/0277546 A1    Sep. 22, 2016

(30) Foreign Application Priority Data

Mar. 17, 2015   (DE) .................. 10 2015 103 942

(51) Int. Cl.
*H04L 7/00* (2006.01)
*H04L 7/04* (2006.01)
(Continued)

(52) U.S. Cl.
CPC ............... *H04B 1/69* (2013.01); *H03L 7/00* (2013.01); *H04B 2001/6912* (2013.01)

(58) Field of Classification Search
USPC ..... 375/219, 220, 221, 222, 240.26, 240.27, 375/254, 259, 284, 285, 295, 316, 346,
(Continued)

(56) References Cited

U.S. PATENT DOCUMENTS 6,477,558 B1 * 11/2002 Irving ................. G06F 9/4887
718/100

7,443,920 B2 * 10/2008 Thesling .................. H04L 7/10
178/20.04
(Continued)

FOREIGN PATENT DOCUMENTS

EP       1 828 867 B1    6/2009

OTHER PUBLICATIONS

Lodz University of Technology, "CAN Specification 2.0, Part B," ftp://ztchs.p.lodz.pl/PIK_POKL/CAN20A.pdf, May 22, 2007, 38 pages.

(Continued)

*Primary Examiner* — Linda Wong
(74) *Attorney, Agent, or Firm* — Harrity & Harrity, LLP (57) ABSTRACT

A method for generating a digital frequency ramp signal including a sequence of frequency ramps is disclosed herein. In accordance with one embodiment of the present invention the method comprises loading a first data word of a data record from a memory. The data record includes information associated with a first frequency ramp, wherein the first data word of the data record includes a header. The method further includes the evaluation of the header to determine whether, or not, the data record includes one or more additional data words and to determine, which information is included in the additional data word(s). Dependent on the evaluation of the header, the additional data word(s) of the data record are loaded from the memory. In accordance with the information stored in the first data word and, if loaded, the additional data word(s) ramp parameters and/or configuration parameters are updated. The method includes, moreover, generating digital ramp signal values in accordance with the updated ramp parameters and synchronous to a clock signal.

12 Claims, 7 Drawing Sheets

(51) Int. Cl.
*H03D 3/24* (2006.01)
*H04B 1/69* (2011.01)
*H03L 7/00* (2006.01)

(58) Field of Classification Search
USPC ....... 375/339, 340, 335, 324, 354, 365, 366, 375/373, 376, 371
See application file for complete search history.

(56) References Cited

U.S. PATENT DOCUMENTS

| | | | | |
|---|---|---|---|---|
| 7,622,977 | B2* | 11/2009 | Papaefthymiou | H03K 3/356139 327/208 |
| 8,306,155 | B2* | 11/2012 | Thesling | H04L 7/10 178/20.04 |
| 8,886,794 | B2* | 11/2014 | Adnani | H04W 24/08 370/338 |
| 2006/0062363 | A1* | 3/2006 | Albrett | G06Q 30/02 379/101.01 |
| 2008/0181344 | A1* | 7/2008 | Jiang | H04L 7/048 375/354 |
| 2011/0033016 | A1* | 2/2011 | Jiang | H04L 7/048 375/354 |
| 2011/0089971 | A1* | 4/2011 | Okyay | H03L 7/06 326/38 |
| 2011/0137604 | A1* | 6/2011 | Dasnurkar | H03M 1/109 702/117 |

OTHER PUBLICATIONS

Klimsa et al., "Computer Science for Engineers consolidated," Springer-Verlag, Jul. 2, 2013, 3 pages.
Riley et al., "Delta-Sigma Modulation in Fractional-N Frequency Synthesis," IEEE Journal of Solid-State Circuits, vol. 28, No. 5, May 1993, 7 pages.

* cited by examiner

| ramp i-1 | $f_{START}$ | $f_{STOP}$ | $T_{RMP}$ | $T_{WAIT}$ | $P_{CONF}$ |
| ramp i | $f_{START}$ | $f_{STOP}$ | $T_{RMP}$ | $T_{WAIT}$ | $P_{CONF}$ |
| ramp i+1 | $f_{START}$ | $f_{STOP}$ | $T_{RMP}$ | $T_{WAIT}$ | $P_{CONF}$ |
| ramp i+2 | $f_{START}$ | $f_{STOP}$ | $T_{RMP}$ | $T_{WAIT}$ | $P_{CONF}$ | time

FREQUENCY RAMP GENERATION

RELATED APPLICATIONS

This application claims priority under 35 U.S.C. §119 to German Patent Application No. 102015103942.7, filed on Mar. 17, 2015, the content of which is incorporated by reference herein in its entirety.

TECHNICAL FIELD

The present disclosure generally relates to the field of RF circuits and devices, in particular to a circuit and a method for generating frequency ramps, which may be used, for example, in FMCW radar sensor systems and devices.

BACKGROUND

In many applications, such as in automotive applications, so-called frequency modulated continuous-wave (FMCW) radar systems are used to detect objects (referred to as radar targets) in front of the radar device and measure the distance to the target(s) as well as the velocity of the target(s).

Usually a digital FMCW radar transceiver system includes a digital controller (often referred to as (frequency) ramp generator or sequencer) for generating frequency ramp signals, e.g. in the form of a sawtooth waveform. The digital output signal of the ramp generator is used to control (i.e. modulate) the frequency of an RF oscillator, which is included in the RF frontend of the radar transceiver. The RF oscillator may be implemented, for example, as a phase locked loop (PLL) with a multi-modulus frequency divider using a sigma delta-modulator to implement a non-integer frequency division ratio (fractional-N frequency divider). Alternatively, a digital-to-analog converter (DAC) may be used to digitally tune the frequency of a voltage controlled oscillator (VCO). Generally, the ramp generator controls the frequency of an RF oscillator to generate the frequency modulated (FM) radar signal used for detecting position and/or velocity of radar targets in front of the radar transceiver.

Modern applications such as, for example, advanced driver assistance systems (ADAS) require sophisticated, programmable schemes of subsequent frequency ramps, including, for example, sawtooth ramps with adjustable start and stop frequency, different frequency change rates, short chirps, repeated burst and pause sequences. In addition to the frequency modulation, the ramp generator may provide ramp-synchronous control and status signals, which are used by other digital or analog circuitry of the radar transceiver. For example, RF power amplifiers may be switched on and off, analog-to-digital converters (ADCs) may be enabled and disabled and other parameters of the RF-frontend may be adjusted.

A frequency ramp (and thus a single chirp) is usually defined by a fixed number of parameters such as, for example, start frequency, chirp duration, steepness, and duration of a subsequent pause (ramp parameters). Additionally, configuration parameters may be associated with the ramp parameters of an individual ramp. As the ramp and configuration parameters have to be loaded into the ramp generator in real-time, the time required to load these parameters is a lower limit of the chirp duration. Furthermore, in applications, in which a plurality of different frequency ramps is needed, memory requirements for storing ramp and configuration parameters are an issue, particularly in a single-chip implementation of the radar transceiver. Thus, there is a need for frequency ramp generators, which allows a more efficient generation of frequency ramps to be used for generating chirp signals.

SUMMARY

A method for generating a digital frequency ramp signal including a sequence of frequency ramps is disclosed herein. In accordance with one embodiment of the present invention the method comprises loading a first data word of a data record from a memory. The data record includes information associated with a first frequency ramp, wherein the first data word of the data record includes a header. The method further includes the evaluation of the header to determine whether, or not, the data record includes one or more additional data words and to determine, which information is included in the additional data word(s). Dependent on the evaluation of the header, the additional data word(s) of the data record are loaded from the memory. In accordance with the information stored in the first data word and, if loaded, the additional data word(s) ramp parameters and/or configuration parameters are updated. The method includes, moreover, generating digital ramp signal values in accordance with the updated ramp parameters and synchronous to a clock signal.

Moreover, a circuit for generating a chirp signals including a sequence of chirps is described herein, wherein each chirp is defined by a corresponding frequency ramp. In accordance with another example of the invention the circuit includes a memory for storing a sequence of data records, wherein each data record comprises one or more data words including information associated with a specific frequency ramp. A first data word of each data record includes a header. Furthermore, the circuit includes a ramp generator which is configured to load the first data word of a first data record of the sequence of data records and to evaluate the header of the first data word to determine whether or not, the first data record includes one or more additional data words in addition to the first data word. The ramp generator is further configured to load, dependent on the evaluation of the header of the first data word, the additional data word(s) of the first data record from the memory, and to update ramp parameters and/or configuration parameters in accordance with the information stored in the first data word and, if loaded, the additional data word(s) of the first data record. Moreover, the ramp generator generates digital ramp signal values in accordance with the updated ramp parameters and synchronous to a clock signal.

BRIEF DESCRIPTION OF THE DRAWINGS

The invention can be better understood with reference to the following drawings and descriptions. The components in the figures are not necessarily to scale; instead emphasis is placed upon illustrating the principles of the invention. Moreover, in the figures, like reference numerals designate corresponding parts. In the drawings.

DETAILED DESCRIPTION OF THE EMBODIMENTS

Embodiments of the present invention are discussed below in the context of a radar transceiver. It should be noted, however, that embodiments of the present invention may also be applied in applications different from radar such as, for example, RF communication devices or ultrasonic (sonar) transceivers.

Figure 1:
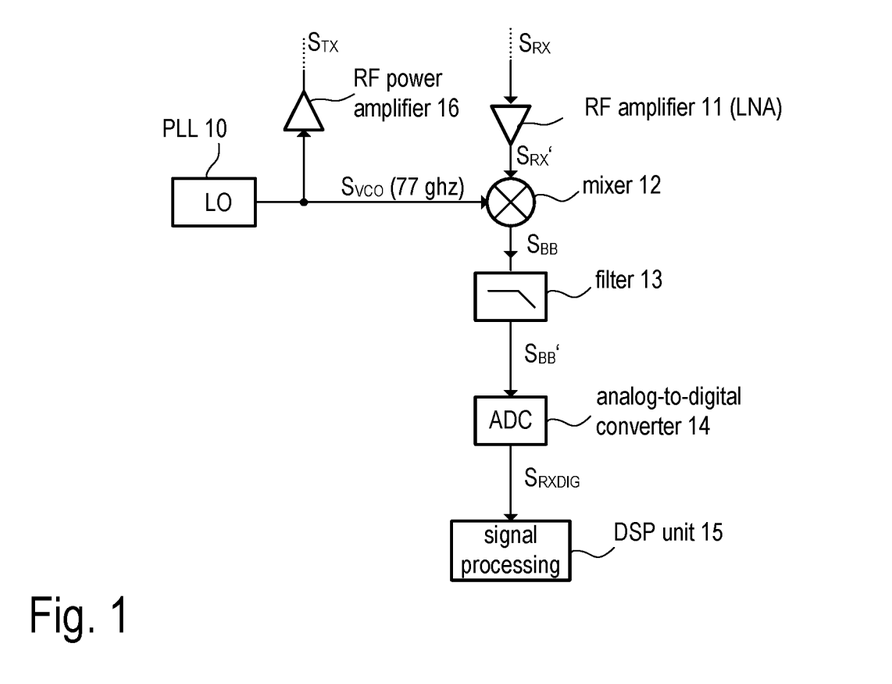
FIG. 1 is a block diagram illustrating the basic structure of a RF frontend of a radar transceiver.

A so-called "single chip radar" may include circuitry providing the core functions needed for distance and/or velocity measurement in one chip. Thus the chip may include, inter alia, radio frequency (RF) oscillators, amplifiers, mixers, filters, analog-to-digital converters, and digital signal processors. FIG. 1 illustrates an example of an RF transceiver 1 as used, for example, in a radar distance measurement device. Accordingly, the RF transceiver 1 includes a transmit signal path, and a receive signal path. The transmit signal path includes an RF power amplifier for amplifying an RF oscillator signal $S_{VCO}$, which is frequency modulated in FMCW radar systems. The RF oscillator signal $S_{VCO}$ is provided by a local oscillator (LO), which includes, in the present example, a phase-locked loop 10. The amplified RF oscillator signal is denoted as $S_{TX}$ and supplied to one or more antennas (not shown). The receive signal path includes an RF amplifier 11 (low noise amplifier, LNA) for amplifying a radar echo signal $S_{RX}$ received by one or more antennas (not shown). The amplified radar echo signal is denoted as $S_{RX}'$ and supplied to an RF input of a mixer 12, which is configured to down-convert the amplified radar signal $S_{RX}'$ into the base band or an intermediate frequency (IF) band, by mixing the amplified radar echo signal $S_{RX}'$ with the RF oscillator signal $S_{VCO}$.

When used in a radar distance measurement device, the RF oscillator signal $S_{VCO}$ may be in the range between approximately 24 GHz and 77 GHz (77 GHz in the present example). However, higher or lower frequencies may also be applicable dependent on the actual application. As mentioned, the mixer 12 down-converts the received signal $S_{RX}'$ (amplified antenna signal) into the base band (or IF band). The respective base band signal (mixer output signal) is denoted by $S_{BB}$. The base band signal $S_{BB}$ is then subject to analog filtering (filter 13) to suppress undesired sidebands or image frequencies. The filter 13 may be a low-pass filter or a bandpass filter. The filtered base band signal (filter output signal) is denoted by $S_{BB}'$. Transceivers, which make use of a mixer to down-convert the RF input signal into the base band or an IF band, are as such known as heterodyne receivers and are thus not further discussed in more detail.

The filtered base band signal $S_{BB}'$ is then sampled and converted to a digital signal $S_{RXDIG}$ (analog-to-digital converter (ADC) 14), which is then further processed in the digital domain using digital signal processing (digital signal processing (DSP) unit 15). In case of a down-conversion into an IF band, the IF signal may also be digitized for a digital de-modulation of the IF signal. The digital signal processing may be performed using, e.g., a digital signal processor executing appropriate software instructions. However, some signal processing may be implemented using dedicated hardware (e.g. a Field Programmable Gate Array (FPGA) or the like).

In so-called bistatic or pseudo-monostatic radar systems the receiver and the transmitter portion of the radar transceiver use separate antennas. However, receiver and transmitter may share one or more antennas in so-called monostatic radar systems. In this case a directional coupler or circulator may be used to separate transmit signals (amplified RF oscillator signal $S_{TX}$) from received signals (radar signal $S_{RX}$).

Figure 2:
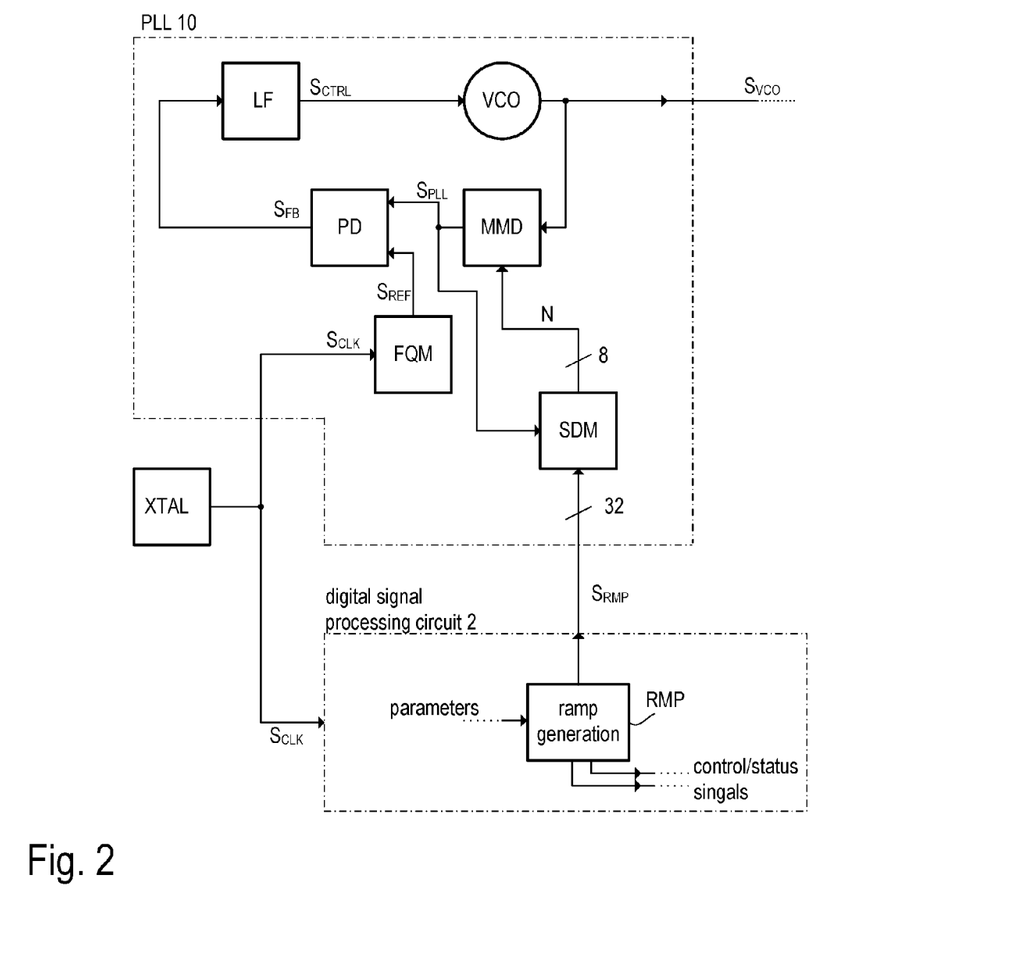
FIG. 2 is a block diagram illustrating a PLL based local oscillator, which may be used in the radar transceiver of FIG. 1.

FIG. 2 illustrates one example of a phase locked loop 10 (PLL) that uses a fractional-N multi-modulus frequency divider, which includes a sigma-delta-modulator to continuously alter the (integer) frequency division modulus so as to accomplish a rational number as effective frequency division modulus. The basic principle of such a PLL is as such known and described, e.g., in Tom A. D. Riley: *Delta-Sigma Modulation in Fractional-N Frequency Synthesis*, in: *IEEE Journal of Solid-State Circuits*, vol. 28, no. 5, May 1993, which shall be incorporated herein by reference.

The PLL 10 includes a voltage controlled oscillator VCO (or, in a fully digital implementation a numerically controlled oscillator, short: NCO), which generates an oscillating output signal $S_{VCO}$ having a frequency denoted as $f_{VCO}$, which is set in accordance with a control input of the oscillator VCO (oscillator control signal $S_{CTRL}$). The oscillating output signal $S_{VCO}$ is supplied to a frequency divider MMD (multi-modulus divider), which has a selectable (integer) division ratio N. That is, the frequency divider MMD is configured to divide (down-scale) the frequency supplied to its input and to generate a divider output signal $S_{PLL}$ having a frequency denoted as $f_{PLL}$, wherein $f_{VCO}=N \cdot f_{PLL}$. The division ratio N is selectable dependent on a signal supplied to a select input of the frequency divider MMD. The output signal $S_{PLL}$ of the frequency divider MMD is also referred to as PLL clock signal. In a radar application the RF oscillator frequency $f_{VCO}$ may be, for example, between 76 GHz and 81 GHz, while the PLL clock signal $S_{PLL}$ may have a PLL clock frequency $f_{PLL}$ in a range from 160 MHz to 200 MHz.

The frequency divider output signal $S_{PLL}$ as well as a reference signal $S_{REF}$, which has a frequency $f_{REF}$, are supplied to a phase detector PD (also known as phase comparator). Dependent on the implementation a phase-frequency-detector PFD may be employed instead. Phase detectors as well as phase-frequency detectors are commonly used in the field of PLLs and therefore not further discussed in more detail.

In the present example, the reference signal $S_{REF}$ is provided by a frequency multiplier FQM, which is configured to multiply (up-scale) a frequency $f_{CLK}$ (also referred to as system clock frequency) of a reference oscillator XTAL, which usually is (but not necessarily has to be) a crystal oscillator. That is, the frequency $f_{REF}$ may be (indirectly) determined by the resonance frequency of a quartz crystal oscillator. Alternatively, the reference signal $S_{REF}$ may directly be provided by the reference oscillator XTAL without any frequency multiplication. The reference frequency $f_{REF}$ may be, for example, in a range between 160 MHz and 200 MHz, while the system clock frequency $f_{CLK}$ provided by the reference oscillator XTAL is, for example, in the range from 40 MHz to 80 MHz. In the present examples, the frequency multiplier FQM uses a multiplication factor between 2 and 5. However, different multiplication factors and frequency values for $f_{CLK}$, $f_{PLL}$, and $f_{VCO}$ may be used, dependent on the application.

The output signal $S_{FB}$ of the phase (-frequency) detector P(F)D usually includes a charge-pump at its output, which generates (as output signal $S_{FB}$) an error signal that is filtered by a loop filter LF, which determines the band-width of the control loop. The charge pump usually drives a current signal to the loop filter, and the output voltage of the loop filter LF is used as control signal $S_{CTRL}$ to adjust the oscillation frequency $f_{VCO}$ of the oscillator VCO, thus closing the control loop. The closed loop ensures that the frequency $f_{VCO}$ is continuously tuned to such a value that the phases of the divider output signal $S_{PLL}$ (PLL clock signal) and the reference signal $S_{REF}$ match. Various implementations of phase (-frequency) detector P(F)D including charge-pumps are as such known in the art and thus not further discussed herein in more detail.

Generally, the division ratio N used by the frequency divider MMD is an integer number. To accomplish a non-integer division ratio, the integer ratio N (e.g. an 8-bit integer number) may be modulated by a sigma-delta-modulator SDM such that the average (and thus effective) division ratio is a rational number. The sigma-delta-modulator SDM may be clocked by the PLL clock signal $S_{PLL}$ (clock frequency $f_{PLL}$) and is supplied with a (e.g. digital) input signal $S_{RMP}$, the values (e.g. 32-bit words) of which represent a rational number. The divider MMD receives an updated division ratio N each clock cycle of $S_{PLL}$ in accordance with the modulator's output. Usually, sigma-delta modulators are used, which have a 3rd order MASH (multi-stage noise shaping) structure, also referred to as MASH3 modulator. As mentioned above, a frequency modulation of the RF oscillator signal $S_{VCO}$ may be accomplished by appropriately tuning the (effectively rational) division ratio N used by the frequency divider MMD. In radar applications, frequency modulation is particularly used to generate so-called chirp signals (also known as sweep or ramp signals). A chirp signal, or simply a chirp, is a signal, in which the frequency increases ("up-chirp") or decreases ("down-chirp") over time. Chirp signals are commonly used in sonar and radar applications, but also in other applications, such as in spread spectrum communications. In practice, the frequency variation of a chirp may be linear (linear chirp, frequency ramp), exponential (exponential chirp) or hyperbolic (hyperbolic chirp).

One way to generate a frequency modulated RF oscillator signal $S_{VCO}$ is to appropriately vary the (rational) division ratio (represented by ramp signal $S_{RMP}$) of the fractional-N frequency divider (composed by multi-modulus divider MMD and sigma-delta modulator SDM). In the following discussion it is assumed that the digital values of ramp signal $S_{RMP}$ are proportional to the desired RF oscillator frequency $f_{VCO}$. The inversion (i.e. calculating the reciprocal) and any scaling, which may be required to obtain a corresponding division ratio, however, may be included in the input stage of the sigma-delta modulator or in the output stage of the ramp generator RMP. In FIG. 2, the digital signal processing circuit 2 including the ramp generator RMP is clocked by the system clock signal $S_{CLK}$ provided by the oscillator XTAL. However, this has to be regarded as an illustrative example.

Alternatively, the digital signal processing circuit 2 may be clocked by the PLL clock signal $S_{PLL}$, the reference signal $S_{REF}$ (or any other clock signal derived therefrom) or even by a click signal generated by a separate oscillator (which may include another PLL). FIG. 2 also illustrates control and status signals provided by the ramp generator RMP in synchronization with the ramp signal $S_{RMP}$.

Figure 3:
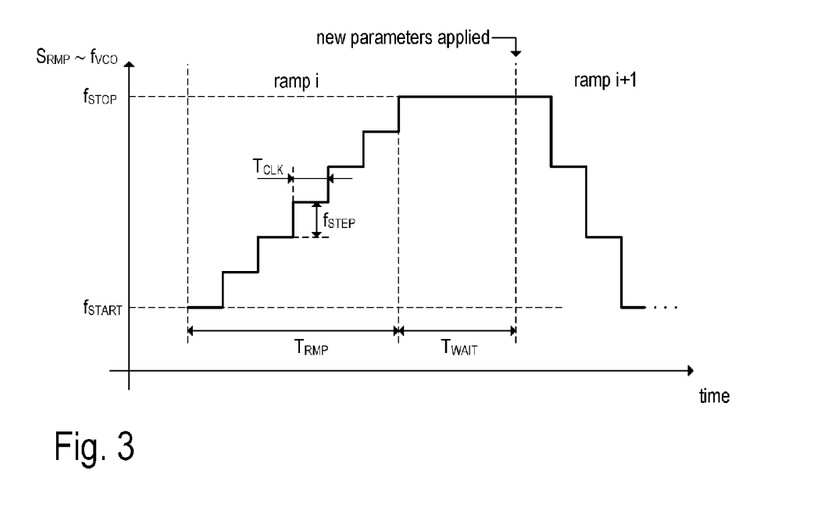
FIG. 3 is an exemplary timing diagram illustrating a frequency ramp signal, which can be used in connection with the PLL of FIG. 2.

FIG. 3 illustrates an exemplary ramp signal $S_{RMP}$, which may be used in connection with the PLL shown in FIG. 2. Each ramp is unambiguously defined by a start frequency $f_{START}$, a stop frequency $f_{STOP}$, a ramp duration $T_{RMP}$ and a duration $T_{WAIT}$ (may be zero) of a pause, which follows the ramp. Given a clock cycle time $T_{CLK}$ (e.g. obtained directly or indirectly from the system clock XTAL), the frequency step size $f_{STEP}$ may be calculated from the values $f_{START}$, $f_{STOP}$ and $T_{RMP}$. In the example of FIG. 3, the first ramp (ramp i) starts with a frequency $f_{START}$. The frequency is increased by the increment $f_{STEP}$ in each clock cycle, until the stop frequency $f_{STOP}$ is reached. A pause of length $T_{WAIT}$ follows, during which the frequency is unchanged. Directly after the pause, the next ramp follows (ramp i+1). In the present example, the second ramp starts at the stop frequency of the first ramp, and stops at the start frequency of the first ramp, while the frequency is deceased in each cycle using a step size higher than the stop size of the first ramp. As illustrated in FIG. 3 the ramp parameters $P_{CONF}$ (see also FIG. 4) for the subsequent ramp have to be loaded and applied by the end of the pause period $T_{WAIT}$ (which is the same time instant as the end of the ramp duration $T_{RMP}$ if $T_{WAIT}$ is zero).

Figure 4:
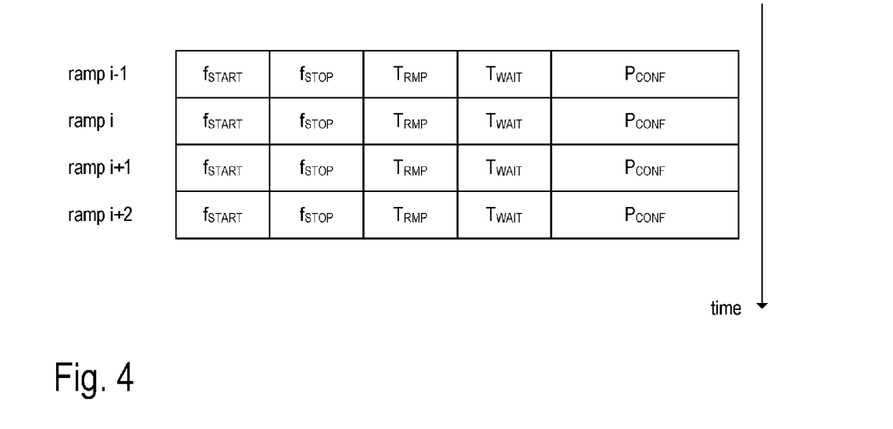
FIG. 4 is a table illustrating the structure of data records used to represent frequency ramps as shown in FIG. 3.

FIG. 4 illustrates the format of a data structure, which unambiguously represents a series of frequency ramps included in the ramp signal $S_{RMP}$ (see FIG. 2). The data words may be stored in a digital memory and subsequently retrieved for ramp generation. Each frequency ramp (ramp i−1, ramp i, ramp i+1, ramp i+2, . . . ) is represented by a data record, wherein each data record has the same data structure with a fixed bit-length and including data fields for the start frequency $f_{START}$, the stop frequency $f_{STOP}$, the ramp duration $T_{RMP}$, and the pause duration $T_{WAIT}$ as illustrated in FIG. 3. Optionally, the data structure may include one or more additional data fields for storing configuration parameters $P_{CONF}$ associated with the respective ramp.

Figure 5:
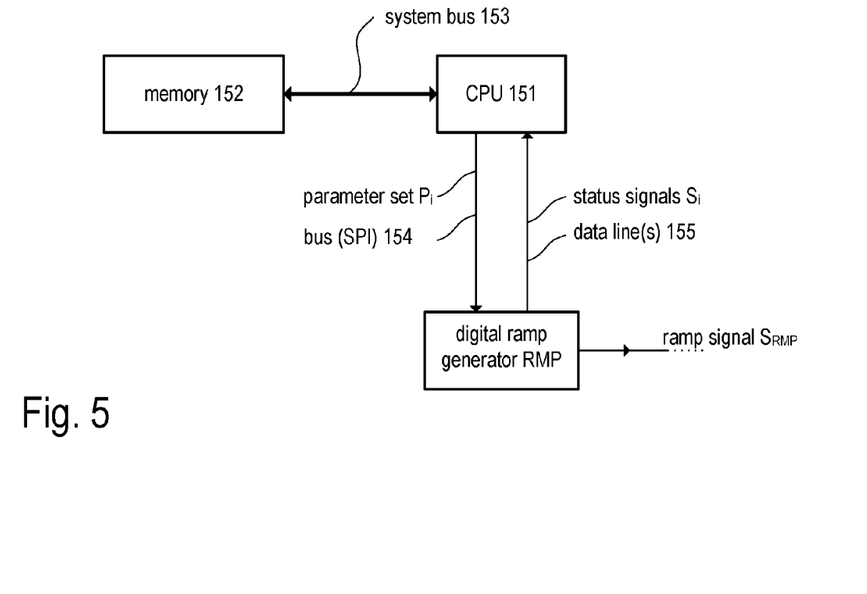
FIG. 5 is a block diagram illustrating one exemplary circuit for digital frequency ramp generation using the data structure shown in FIG. 4.

FIG. 5 illustrates one exemplary circuit, which may be used for the generation of frequency ramps using the data format shown in FIG. 4. The circuit of FIG. 5 may be part of the signal processing unit 15 shown in FIG. 1 and the circuit 2 shown in FIG. 2. A memory 152 is used to store the data records shown in FIG. 3, wherein each a data record is associated with a specific frequency ramp. A micro-processor (e.g. CPU 151) is connected with the memory 152 via a system bus 153. Furthermore, a digital ramp generator RMP is connected to the CPU, e.g. via a data bus 154 such as SPI, I2C or any other suitable bus (different from the system bus 153). The CPU 151 is programmed to retrieve, for each frequency ramp, a corresponding data record from the memory 152 and provide the ramp parameters (and optional configuration parameters $P_{CONF}$, see FIG. 3) included in the data record to the digital ramp generator RMP via data bus 154. The digital ramp generator RMP may be implemented as a finite state machine, which is configured to request a new set of ramp (and configuration) parameters $P_i$ from the CPU for each new ramp (ramp i). The parameters have to be loaded and applied in real time. That is, the process of loading new ramp parameters for a specific ramp i has to be completed during the output of the preceding ramp i−1. Besides the ramp signal $S_{RMP}$, control and status signals $S_i$ may be generated (at data lines 155) and supplied to CPU 151 or any other components involved in the process of generating the FM oscillator signal $S_{VCO}$ (see FIGS. 1 and 2). The control and status signals $S_i$ represent the mentioned configuration parameters and may be based on the configuration parameters $P_{CONF}$. As mentioned, the control and status signals may be used by other digital or analog circuitry of the radar transceiver. For example, RF power amplifiers may be switched on and off, analog-to-digital converters (ADCs) may be enabled and disabled and other parameters of the RF-frontend may be adjusted. A specific control signal may be an interrupt signal to signal an interrupt to a processing unit.

Figure 6:
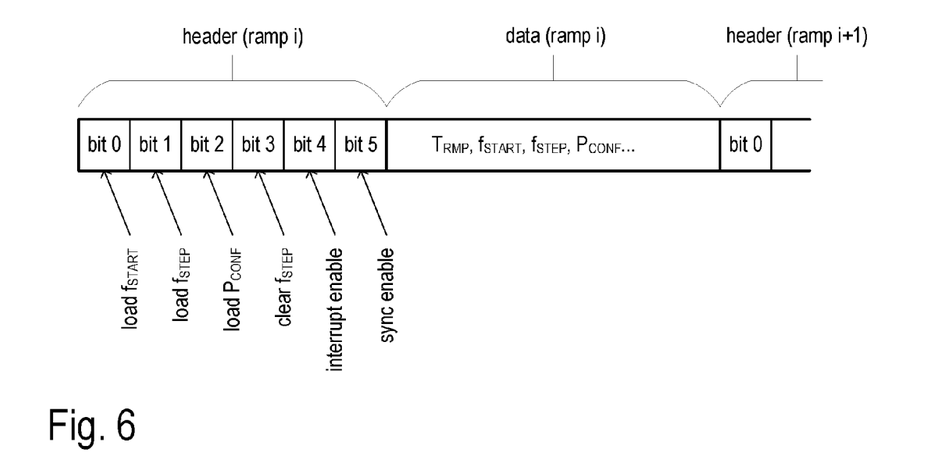
FIG. 6 is a table generally illustrating a data stream representing a series of subsequent frequency ramps.
Figure 7:
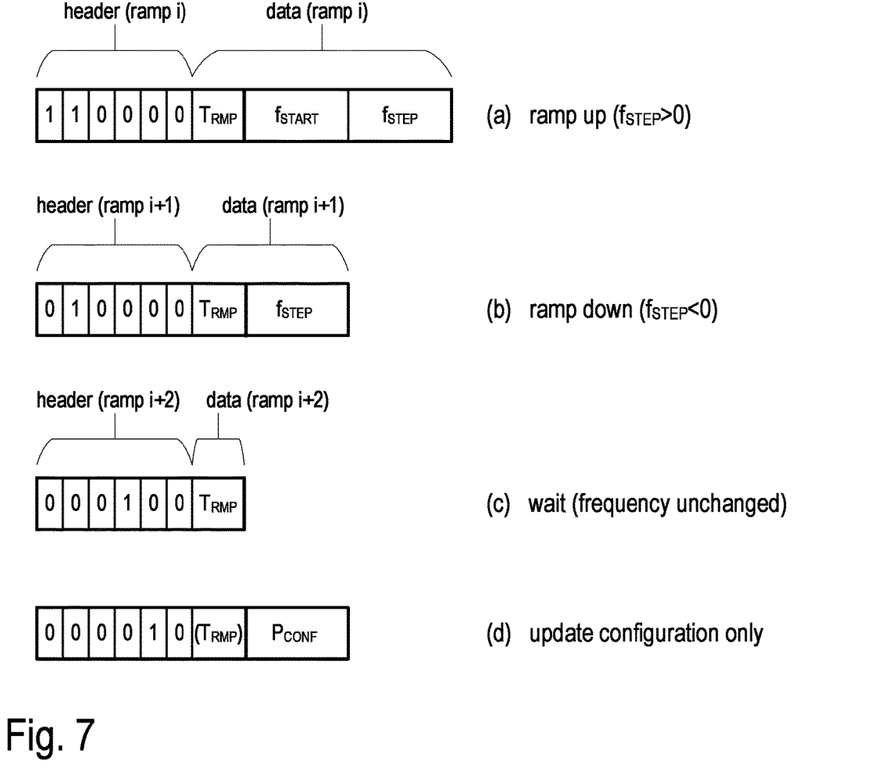
FIG. 7 (which includes sub-FIGS. 7a, 7b, 7c, 7d) illustrates exemplary data records representing different frequency ramps and included in a data stream as shown in FIG. 6.

In the implementation shown in FIGS. 4 and 5, the CPU 151 is significantly involved in the ramp generation process as a new data record has to be loaded each time the ramp waveform, which is to be generated, changes. Furthermore, the amount of data to be stored in memory is significant and, moreover, partially redundant (e.g. two subsequent ramps usually do not differ in each single parameter). FIGS. 6 and 7 illustrate the structure of a data stream, which represents a plurality of subsequent frequency ramps. Different from the previous example of FIG. 4, the individual data records included in the data stream do not have equal sizes as redundant data is avoided. Using the data structure of FIG. 6, a frequency ramp is defined by the ramp duration $T_{RMP}$, the start frequency $f_{START}$ and the step size $f_{STEP}$ (see also FIG. 3). Optionally configuration parameters $P_{CONF}$ may be included in a data record. A data record representing a specific ramp does not necessarily include all parameters $T_{RMP}$, $f_{START}$, $f_{STEP}$, and $P_{CONF}$. Only those parameters are included, which are needed for generating a specific ramp. For example, if the start frequency of a specific ramp is the same as the stop frequency of the preceding ramp, it would be redundant to include the start frequency for that specific ramp in the respective data record. Similarly, if the step size of a specific ramp is the same as the step size of the preceding ramp, there is no need to include the step size for that specific ramp in the respective data record. Generally, only those parameters, which are different from the corresponding parameters of the preceding ramp, are included in the data record of a specific ramp. Each data record includes a header, which is composed of only a few bits (six bits in the present example) and which is indicative of which data fields (parameters) are included in the respective data record.

In the present example, the header is included in the first data field, which also includes the ramp duration $T_{RMP}$. The first bit (load $f_{START}$) of the header is set to 0 or 1 to indicate whether or not a data field including a start frequency is included in the current data record. The second bit (load $f_{STEP}$) of the header is set to 0 or 1 to indicate whether or not a data field including a frequency step size is included in the current data record. The third bit (load $P_{CONF}$) of the header is set to 0 or 1 to indicate whether or not a data field including configuration parameters $P_{CONF}$ is included in the current data record. The fourth bit (clear $f_{STEP}$) of the header is set to 0 or 1 to indicate whether or not to clear (set to zero) current step size value. The fifth and the sixth bits (interrupt enable and sync enable) may indicate to the ramp generator to generate an interrupt strobe signal or, respectively, a synchronization pulse signal in synchronization with the start of a ramp signal. These signals may be evaluated by the CPU 151 or other circuit components. Some specific examples are given in FIGS. 7a to 7d. However, it should be noted that the information in the header may be different in other examples and depend on the actual implementation of the system. At the end of a data record associated with a specific ramp, the next record (associated with the subsequent ramp) follows.

FIG. 7a illustrates a data record including data fields for the parameters $T_{RMP}$, $f_{START}$, and $f_{STEP}$, which fully define a frequency ramp (bit 0 and bit 1 of the header are set to "1"). Assuming the step size $f_{STEP}$ is a positive value, the frequency is increased in each clock cycle to generate an upward ramp. The next data record (FIG. 7b) illustrates a simple data record, which may be used to only change the frequency step size whereas the remaining parameters are unchanged (as compared to the preceding ramp). That is, the start frequency of the current ramp equals the stop frequency of the preceding ramp. Also the ramp duration is unchanged. FIG. 7c illustrates the data record associated with a pause. Accordingly, a pause is regarded as a ramp with step size $f_{STEP}$ of zero. Accordingly, only the "clear $f_{STEP}$"-bit is set to "1" in this example. The parameter $T_{RMP}$ defines the pause duration in this case. The example of FIG. 7d illustrates a data record, which may be used for changing configuration parameters, while ramp parameter $T_{RMP}$ is irrelevant and may be ignored in this specific case.

Figure 8:
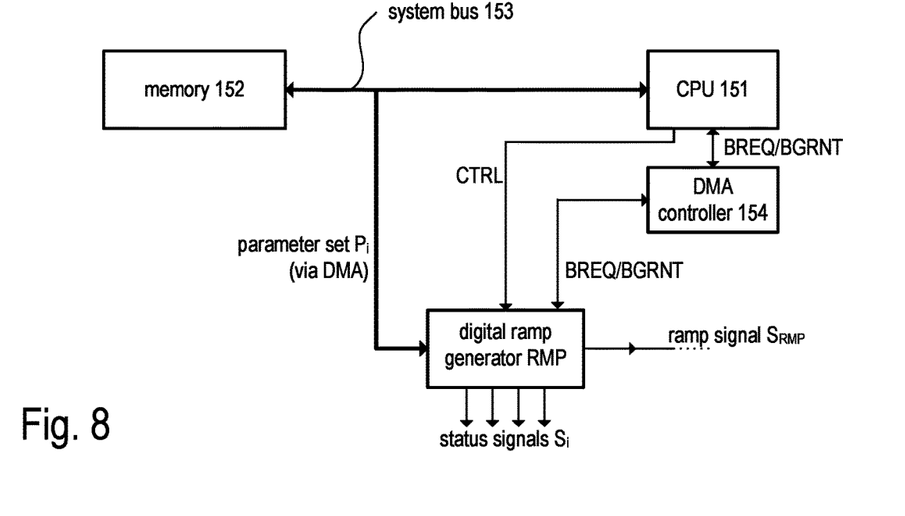
FIG. 8 is a block diagram illustrating one embodiment of an improved digital frequency ramp generator using the data stream shown in FIG. 6 for ramp generation.
Figure 9:
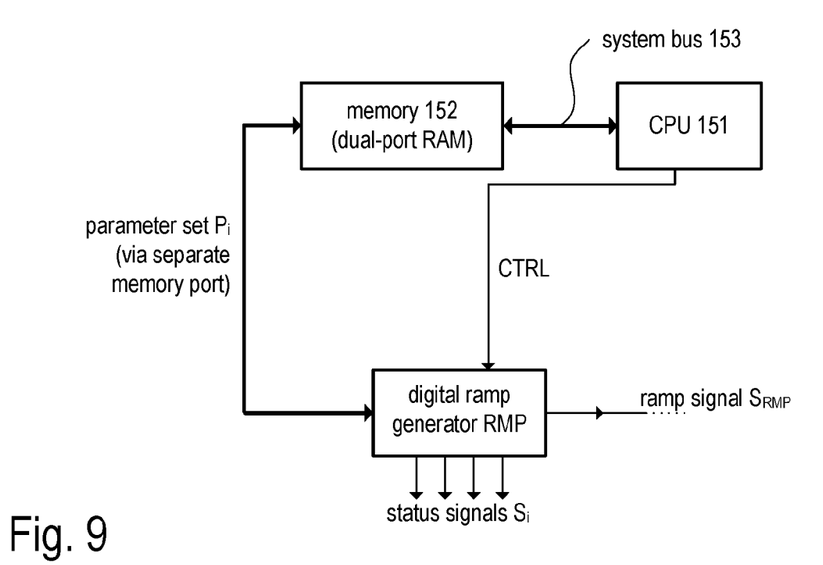
FIG. 9 is a block diagram illustrating another embodiment of an improved digital frequency ramp generator using the data stream shown in FIG. 6.

FIG. 8 illustrates an improved circuit that may be employed for generating frequency ramps using a stream of variable-length data records as shown in FIGS. 6 and 7. Like in the previous example of FIG. 5, a CPU 151 is connected to a memory 152 via a system bus 153. However, different from the previous example, the ramp generator is directly connected to the system bus 153 and capable to retrieve the data records as shown in FIG. 6 directly from memory 152 using direct memory access (DMA). Using DMA unburdens CPU 151 from the task of loading the data records and sending the ramp parameters to the ramp generator RMP. The task of controlling the ramp generator RMP, e.g. triggering the generation of a sequence of ramps, may, however, remain at the CPU 151. Dependent on the actual implementation of the DMA, a DMA controller 156 may be provided which is configured to manage memory access between the CPU 151 and circuit components (e.g. the ramp generator RMP), which can use the system bus without direct control by the CPU 151. For this purpose, the DMA controller 156 may be configured to handle bus request signals BREQ from the ramp generator RMP to the CPU 151 and bus grant signals BGRNT from CPU 151 to the ramp generator RMP (via the DMA controller). Other implementations may use a dual-port memory, or different arbitration schemes, which are commonly known in the field of computer architecture and thus not further discussed here in more detail. However, the mentioned alternative, which makes use of a dual-port memory is shown in FIG. 9. Accordingly, the example of FIG. 9 is essentially the same as the previous example of FIG. 8, wherein, however, a DMA controller is not needed as digital ramp generator RMP and CPU 151 are coupled to different memory ports of memory 152, which is implemented as a dual port RAM in the present example. The arbitration logic for preventing simultaneous memory access via both ports is usually included in the memory device 152.

Figure 10:
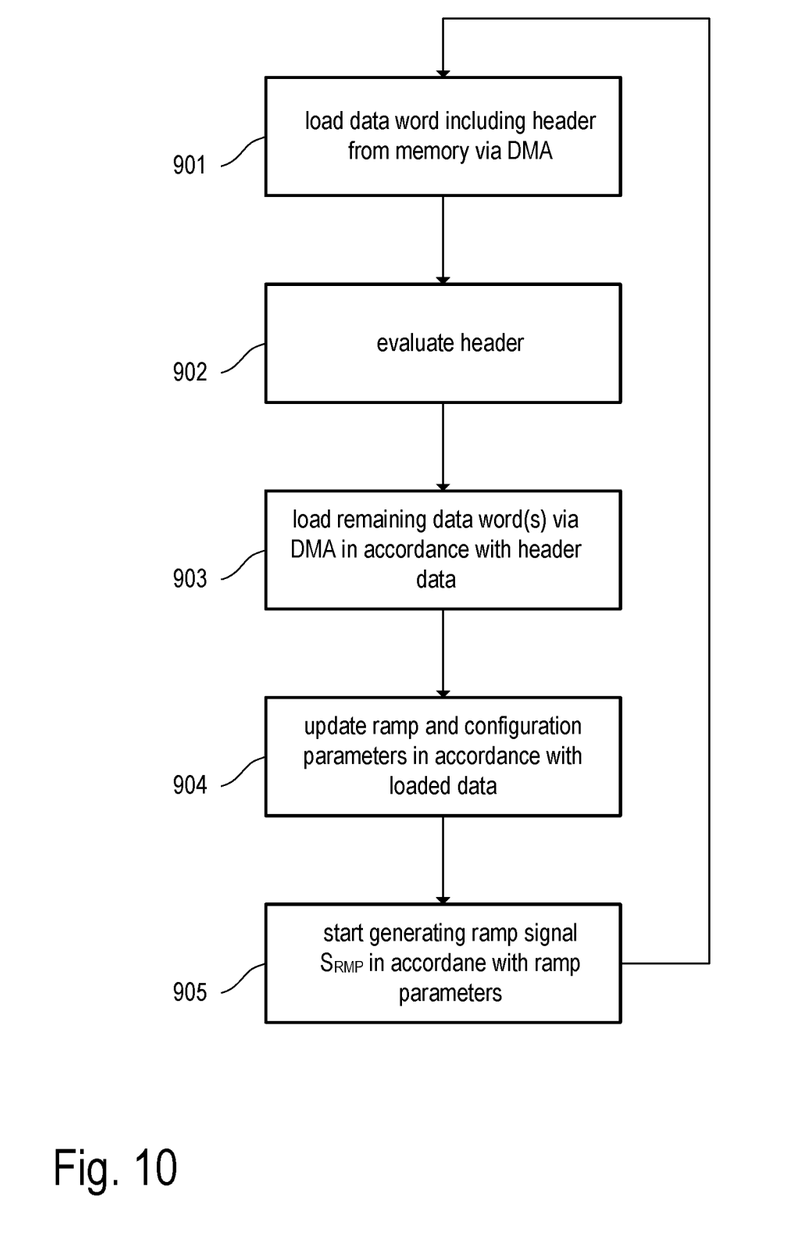
FIG. 10 is a flow chart illustrating a method for ramp generation as performed by the embodiment of FIG. 8.

As mentioned above, the ramp generator may be implemented as finite state machine and, once triggered, operate autonomously and independent from the control by the CPU 151. FIG. 10 illustrates a flow chart, which illustrates a method executed by the state machine. When activated the digital ramp generator RMP loads a first data word of a data record from memory 152 using DMA (step 901). The data record includes information associated with a specific frequency ramp and the first data word includes the header. The header portion of the data word is evaluated (step 902) to determine whether or not, the data record includes one or more additional data words and (if the data record includes one or more additional data words) which information is included in the additional data word(s). Dependent on the evaluation, subsequent data word(s) with additional information are loaded via DMA (step 903). The loaded data is used to update (step 904) ramp parameters ($T_{RPM}$, $f_{START}$, $f_{STEP}$) and configuration parameters ($P_{CONF}$) in accordance with the information stored in the first data word and, if applicable, the additional data word(s). The ramp and configuration parameters are stored in corresponding registers of the ramp generator RMP. Once the ramp and configuration parameters are updated, the generation and output of the ramp signal values (digital signal $S_{RMP}$) is initiated in accordance with the current parameters (step 905) and synchronous to a clock signal (e.g. provided by or derived from the system clock XTAL, see FIG. 2). To avoid a pause between subsequent chirps, the ramp generator may concurrently load the next data word (step 901), evaluate the header (step 902) and load the remaining data words (step 903) while the ramp signal is generated (step 905), thus effectively buffering one or more data records associated with the subsequent ramps.

Although the invention has been illustrated and described with respect to one or more implementations, alterations and/or modifications may be made to the illustrated examples without departing from the spirit and scope of the appended claims. In particular regard to the various functions performed by the above described components or structures (units, assemblies, devices, circuits, systems, etc.), the terms (including a reference to a "means") used to describe such components are intended to correspond—unless otherwise indicated—to any component or structure, which performs the specified function of the described component (e.g., that is functionally equivalent), even though not structurally equivalent to the disclosed structure, which performs the function in the herein illustrated exemplary implementations of the invention.

In addition, while a particular feature of the invention may have been disclosed with respect to only one of several implementations, such feature may be combined with one or more other features of the other implementations as may be desired and advantageous for any given or particular application.

The invention claimed is:

1. A method for generating a digital frequency ramp signal including a sequence of frequency ramps, the method comprising:
    loading a first data word of a data record from a memory, the data record including information associated with a first frequency ramp, and
        the first data word of the data record including a header;
    evaluating the header to determine whether the data record includes one or more additional data words and to determine which information is included in the one or more additional data words;
    loading, dependent on the evaluation of the header, the one or more additional data words of the data record from the memory;
    updating ramp parameters and/or configuration parameters in accordance with the information stored in the first data word and, if loaded, the one or more additional data words;
    generating the digital frequency ramp signal in accordance with the updated ramp parameters and synchronous to a clock signal; and
    controlling a frequency of a radio frequency oscillator based on the digital frequency ramp signal.

2. The method of claim 1, further comprising:
    loading, at least partially simultaneous with generating the digital frequency ramp signal in accordance with the updated ramp parameters, a first data word of a further data record from the memory, the further data record including information associated with a second frequency ramp subsequent to the first frequency ramp;
    evaluating, at least partially simultaneous with generating the digital frequency ramp signal in accordance with the updated ramp parameters, a header of the first data word of the further data record to determine whether the further data record includes one or more additional data words; and
    loading, at least partially simultaneous with generating the digital frequency ramp signal in accordance with the updated ramp parameters and dependent on the evaluation of the header of the first data word of the further data record, the one or more additional data words of the further data record from the memory.

3. The method of claim 1, wherein the ramp parameters include at least one of:
    a ramp duration,
    a start frequency, or
    a frequency step.

4. The method of claim 1, further comprising:
    generating at least one control signal in accordance with the updated configuration parameters and synchronous to the digital frequency ramp signal.

5. The method of claim 4, wherein the at least one control signal includes an interrupt signal for signaling an interrupt to an interrupt controller of a processing unit.

6. The method of claim 1, wherein loading the first data word of the data record from the memory includes using direct memory access to access the memory.

7. A circuit for generating a chirp signal including a sequence of chirps, each chirp, of the sequence of chirps, being defined by a corresponding frequency ramp, the circuit comprising:
    a memory for storing a sequence of data records,
        wherein each data record, of the sequence of data records, comprises one or more data words including information associated with a specific frequency ramp,
            a first data word, of the one or more data words of each data record, including a header; and
    a ramp generator configured to:
        load the first data word of a first data record of the sequence of data records;
        evaluate the header of the first data word to determine whether the first data record includes one or more additional data words in addition to the first data word;
        load, dependent on the evaluation of the header of the first data word, the one or more additional data words of the first data record from the memory;
        update ramp parameters and/or configuration parameters in accordance with the information stored in the first data word and, if loaded, the one or more additional data words of the first data record;
        generate a digital ramp signal in accordance with the updated ramp parameters and synchronous to a clock signal; and
        output the digital ramp signal to control generation of the chirp signal by a radio frequency oscillator.

8. The circuit of claim 7, further comprising:
    a processing unit, which is programmed to at least partially control operation of the ramp generator.

9. The circuit of claim 8, wherein the processing unit is connected to the memory via a system bus.

10. The circuit of claim 7, wherein the ramp generator is configured to access the memory via a direct memory access (DMA) technique.

11. The circuit of claim 8, wherein the memory has at least two memory ports, wherein the processing unit and the ramp generator are connected to two different ports of the at least two memory ports.

12. The circuit of claim 9,
   wherein the ramp generator is connected to the memory via the system bus, and
   wherein the circuit further comprises a DMA controller configured to arbitrate direct memory access between the ramp generator and the processing unit.

* * * * *